(12) United States Patent
Vehonsky et al.

(10) Patent No.: US 11,776,864 B2
(45) Date of Patent: Oct. 3, 2023

(54) CORNER GUARD FOR IMPROVED ELECTROPLATED FIRST LEVEL INTERCONNECT BUMP HEIGHT RANGE

(71) Applicant: Intel Corporation, Santa Clara, CA (US)

(72) Inventors: Jacob Vehonsky, Gilbert, AZ (US); Nicholas S. Haehn, Scottsdale, AZ (US); Thomas Heaton, Mesa, AZ (US); Steve S. Cho, Chandler, AZ (US); Rahul Jain, Gilbert, AZ (US); Tarek Ibrahim, Mesa, AZ (US); Antariksh Rao Pratap Singh, Gilbert, AZ (US); Edvin Cetegen, Chandler, AZ (US); Nicholas Neal, Scottsdale, AZ (US); Sergio Chan Arguedas, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 896 days.

(21) Appl. No.: 16/511,376

(22) Filed: Jul. 15, 2019

(65) Prior Publication Data

US 2021/0020532 A1 Jan. 21, 2021

(51) Int. Cl.
*H01L 23/16* (2006.01)
*H01L 23/498* (2006.01)
*H01L 23/367* (2006.01)
*H01L 23/00* (2006.01)

(52) U.S. Cl.
CPC .......... *H01L 23/16* (2013.01); *H01L 23/3675* (2013.01); *H01L 23/49838* (2013.01); *H01L 24/11* (2013.01); *H01L 24/16* (2013.01); *H01L 2224/10152* (2013.01); *H01L 2224/11011* (2013.01); *H01L 2224/11462* (2013.01); *H01L 2224/16227* (2013.01); *H01L 2924/381* (2013.01)

(58) Field of Classification Search
CPC ...................................................... H01L 23/16
See application file for complete search history.

(56) References Cited

U.S. PATENT DOCUMENTS

| 6,365,978 | B1 * | 4/2002 | Ibnabdeljalil | ..... H01L 23/49816 257/737 |
| 2015/0096787 | A1 * | 4/2015 | Perng | ................... H05K 1/0213 174/250 |
| 2017/0287873 | A1 * | 10/2017 | Sankarasubramanian | ................... H01L 24/17 |

\* cited by examiner

*Primary Examiner* — William A Harriston
(74) *Attorney, Agent, or Firm* — Schwabe, Williamson & Wyatt P.C.

(57) ABSTRACT

Embodiments disclosed herein include electronic packages and methods of forming such packages. In an embodiment an electronic package comprises a package substrate, and a first level interconnect (FLI) bump region on the package substrate. In an embodiment, the FLI bump region comprises a plurality of pads, and a plurality of bumps, where each bump is over a different one of the plurality of pads. In an embodiment, the electronic package further comprises a guard feature adjacent to the FLI bump region. In an embodiment, the guard feature comprises, a guard pad, and a guard bump over the guard pad, wherein the guard feature is electrically isolated from circuitry of the electronic package.

25 Claims, 9 Drawing Sheets

CORNER GUARD FOR IMPROVED ELECTROPLATED FIRST LEVEL INTERCONNECT BUMP HEIGHT RANGE

TECHNICAL FIELD

Embodiments of the present disclosure relate to semiconductor devices, and more particularly to electronic packages with guards for improved first level interconnect bump height range.

BACKGROUND

Sharp changes in local metal density within the first level interconnect layer (FLI) leads to non-uniform electro-deposition of incoming metal ions within each unit. The most drastic differences in plated bump thickness occur between edge bumps and interior bumps. Particularly, the portion of the FLI bump region proximate to the edge has a lower copper density compared to the portion of the FLI bump region proximate to the interior. This non-uniformity in copper density results in a large variations in the current density during plating, and produces large average bump thickness variation (rBTV) within the electronic package. The large rBTV generates package assembly issues, and therefore, high yield losses. Furthermore, as the FLI bumps continue to scale to smaller pitches, the copper uniformity becomes more pronounced and leads to an increase in the rBTV. This is particularly problematic because decreases in pitch will also drive decreases in the rBTV specification.

EMBODIMENTS OF THE PRESENT DISCLOSURE

Described herein are electronic packages with guards for improved first level interconnect bump height range, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, large average bump thickness variation (rBTV) in the first level interconnect (FLI) bump region results in significant assembly issues that lead to low yields. Particularly, the large rBTV results from the inability to normalize current densities across the bumps during a plating process, because the pads onto which the bumps are plated do not have uniform boundary conditions. Currently, design specifications dictate that the rBTV be approximately 10 μm or less. However, as the pitch of the FLI bump region continues to decrease, rBTV specifications are expected to decrease despite the control of rBTV becoming more challenging.

Figure 1A:
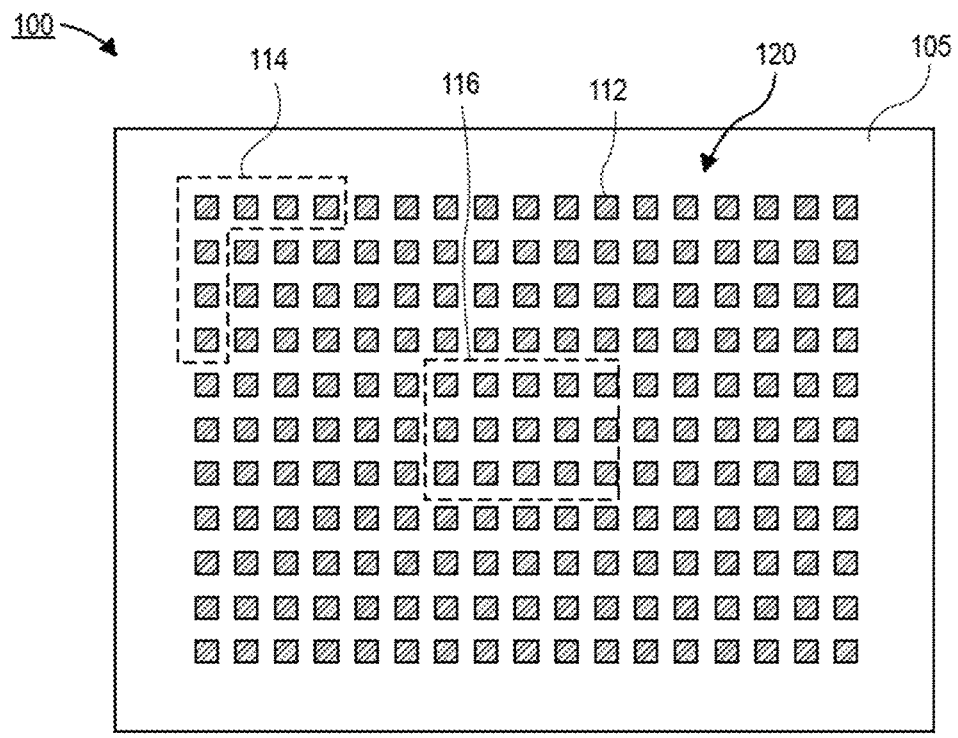
FIG. 1A is a plan view illustration of a first level interconnect (FLI) bump region on an electronic package, in accordance with an embodiment.

Referring now to FIG. 1A, a plan view illustration of an FLI bump region 120 of an electronic package 100 is shown. As illustrated, the FLI bump region 120 comprises a plurality of bumps 112 arranged in an array across the package substrate 105. The bumps 112 do not all have uniform boundary conditions. For example, each of the bumps 112 in an interior region 116 of the FLI bump region 120 are bordered on each side by another bump 112. However, in an edge region 114, not all edges of each bump 112 are bordered by another bump 112. Due to the decreased metal density along the edge region 114, the current density applied to the bumps 112 in the edge region 114 is greater than the current density applied to the bumps 112 in the interior region 116. As such, the height of the bumps 112 in the edge region 114 is typically greater than the height of the bumps 112 in the interior region 116.

Figure 1B:
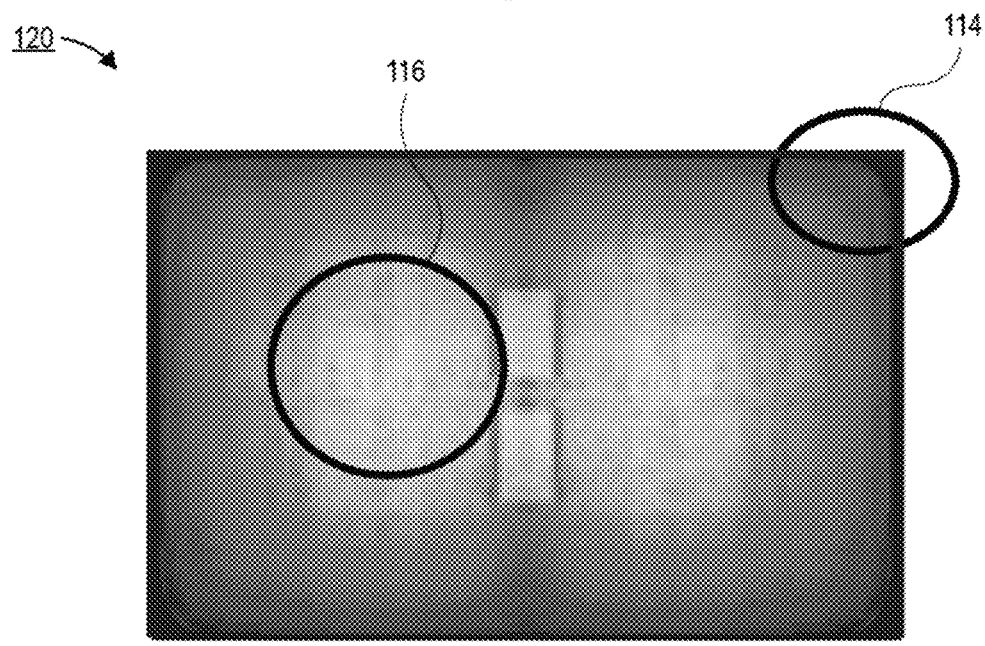
FIG. 1B is a heat map that illustrates the variation in bump height thicknesses across the FLI bump region, in accordance with an embodiment.

Referring now to FIG. 1B, a heat map of the FLI bump region 120 is shown. In FIG. 1B darker shading indicates a higher bump height. As shown, the shading indicates that the bump heights increase towards the edge region 114 of the FLI bump region 120, while the interior region 116 of the FLI bump region 120 has a substantially uniform bump height. Particularly, it is shown that the bump height variation is most pronounced along the corners of the FLI bump region 120.

Accordingly, embodiments disclosed herein provide guard features that target the bump height variations along the edge regions 114. The guard features are dummy features that locally increase the metal density in order to improve the current density uniformity across the entire FLI bump region 120. That is, the guard features are plated in parallel with the FLI bumps, but are not electrically coupled to the electrical circuitry of the electronic package.

Figure 2A:
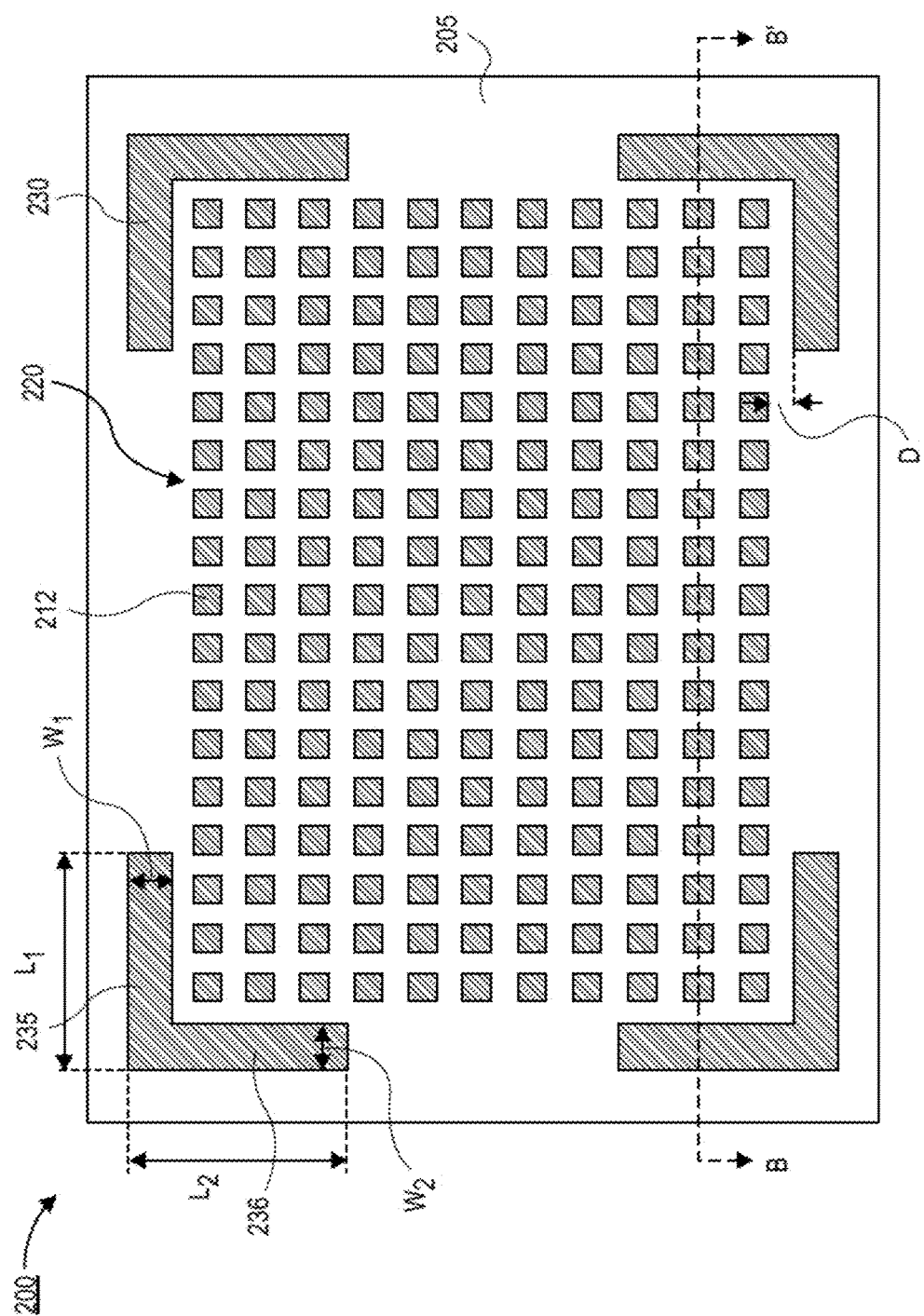
FIG. 2A is a plan view illustration of an FLI bump region on an electronic package with corner guard features, in accordance with an embodiment.

Referring now to FIG. 2A, a plan view illustration of an electronic package 200 is shown, in accordance with an embodiment. In an embodiment, the electronic package 200 may comprise a package substrate 205. The package substrate 205 may include any suitable dielectric materials. For example, the package substrate 205 may comprise a plurality of laminated dielectric layers. Conductive features, (e.g., traces, vias, pads, etc.) may be disposed in the package substrate 205. The package substrate 205 may also comprise embedded components, such as passive components and/or active components. For example, the package substrate 205 may comprise bridges, interposers, or the like.

In an embodiment, an FLI bump region 220 may be disposed over the package substrate 205. The FLI bump region 220 may comprise an array of FLI bumps 212. The FLI bumps 212 may be bumps suitable for providing a connection to a die (not shown). In an embodiment, the FLI bumps 212 may comprise copper bumps, solder bumps, or combinations of copper bumps and solder bumps. In an embodiment, the FLI bumps 212 have a low rBTV. For example, the rBTV may be approximately 10 μm or less, or 5 μm or less. The low rBTV may be attributable to the inclusion of one or more guard features 230 adjacent to the FLI bump region 220.

In an embodiment, the guard features 230 may comprise a material that is substantially similar to the FLI bumps 212. Particularly, the guard features 230 and the FLI bumps 212 are plated with a single plating process. In an embodiment, the guard features 230 may be positioned proximate to portions of the FLI bump region 220 that have low metal density. As noted above, the regions of low metal density experience a higher current density during plating, which results in increased thicknesses. This negative impact on rBTV is mitigated by providing guard features 230 proximate to these regions in order to reduce the current density. As such, the guard features 230 normalize the current density so that the current density of the interior portions of the FLI bump region 220 more closely match the current density of the exterior portions of the FLI bump region 220.

As noted above, the current density typically spikes most proximate to the corners of the FLI bump regions 220. Accordingly, in some embodiments, one or more guard features 230 are positioned proximate to the corners of the FLI bump region 220. As shown in FIG. 2A, a guard feature 230 is positioned proximate to each of the four corners of the FLI bump region 220. However, it is to be appreciated that the guard features 230 may be positioned adjacent to less than all of the corners of the FLI bump region 220 in some embodiments.

In an embodiment, the guard features 230 may be positioned as close to the FLI bump region 220 as possible. In the illustrated embodiments, the interior surfaces of the guard features 230 are spaced a distance D from the nearest edge of bumps 212 along the perimeter of the FLI bump regions 220. For example, the distance D may be approximately 5 mm or less, approximately 3 mm or less, or approximately 2 mm or less.

In the illustrated embodiment, the guard features 230 are shown as having a substantially L-shaped footprint. That is, each guard features 230 may comprise a first leg 235 and a second leg 236 that are connected to each other at a substantially orthogonal angle. The use of an L-shaped footprint allows for the guard features 230 to wrap around the corner of the FLI bump region 220. That is, a single guard feature 230 may be adjacent to a first edge of the FLI bump region 220 and a second edge of the FLI bump region 220. While an L-shaped footprint is depicted in FIG. 2A, it is to be appreciated that L-shaped footprints are exemplary in nature, and not all guard features 230 will have L-shaped footprints. For example, some guard features 230 may be substantially rectangular. Furthermore, while all of the guard features 230 in FIG. 2A are depicted as having substantially the same footprint, it is to be appreciated that guard features 230 with different footprints may be included in an electronic package 200.

In an embodiment, the guard features 230 may have any dimensions suitable for equalizing the current density across an FLI bump region 220. In the illustrated embodiment, each of the first leg 235 and the second leg 236 of a guard feature 230 are shown as having substantially equal lengths $L_1$ and $L_2$. However, it is to be appreciated that the first length $L_1$ of the first leg 235 may be different than a second length $L_2$ of the second leg 236 in some embodiments. In accordance with an embodiment, the first length $L_1$ and the second length $L_2$ may be approximately 15 mm or less, approximately 10 mm or less, or approximately 5 mm or less. In an embodiment, a first width $W_1$ of the first leg 235 and a second width $W_2$ of the second leg 236 may be substantially uniform. In other embodiments, the first width $W_1$ may be different than the second width $W_2$. For example, the first width $W_1$ and the second width $W_2$ may be approximately 5 mm or less, or approximately 3 mm or less.

Figure 2B:
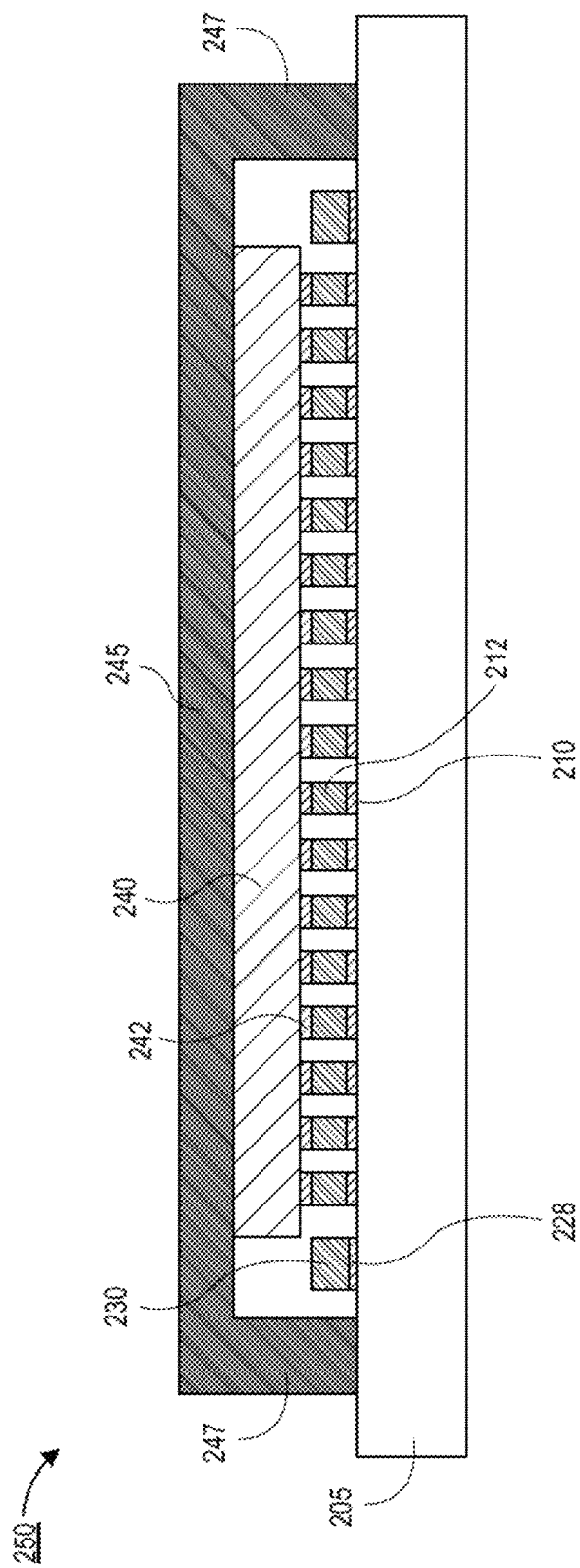
FIG. 2B is a cross-sectional illustration of an electronic package that comprises corner guard features, in accordance with an embodiment.

Referring now to FIG. 2B, a cross-sectional illustration of an electronic package 250 along line B-B' in FIG. 2A is shown, in accordance with an embodiment. In FIG. 2B, additional features not shown in FIG. 2A are included. For example, the die 240 and the integrated heat spreader 245 are shown in FIG. 2B, but were omitted from FIG. 2A in order to not obscure the illustration of the FLI bump region 220.

In an embodiment, the electronic package 250 may comprise a package substrate 205 and a plurality of bump pads 210 over the package substrate 205. In an embodiment, the bumps 212 may be disposed over the bump pads 210. The guard features 230 may be disposed over guard pads 228. The guard pads 228 and the bump pads 210 may be fabricated substantially in parallel. Similarly, the bumps 212 and the guard features 230 may be fabricated substantially in parallel. Accordingly, no additional lithography or deposition processes are needed in order to fabricate the guard features 230. Also, since the guard features 230 and the bumps 212 are deposited with the same process, the guard features 230 and the bumps 212 may comprise substantially the same material composition.

In an embodiment, the die 240 may comprise die pads 242 that are coupled to the bumps 212. In an embodiment, the die 240 may be any type of die. For example, the die 240 may be a processor, a graphics processor, a memory die, or any other type of die. The guard features 230 may be outside of a footprint of the die 240. In some embodiments, a portion of the guard features 230 may be within a footprint of the die 240 depending on how close the guard features 230 are spaced from the bumps 212. Even when the guard feature 230 is within a footprint of the die 240, the guard feature 230 will not contact the die 240. This is because there are no die pads 242 over the guard features 230. Accordingly, a gap will be present between the top surfaces of the guard features 230 and a bottom surface of the die 240 in some embodiments. As such, it is to be appreciated that the guard features 230 are not electrically coupled to circuitry of the package substrate 205 or to circuitry of the die 240.

While not shown in FIG. 2B, it is to be appreciate that an underfill material may be disposed between the die 240 and the package substrate 205. That is, the underfill material may surround the bump pads 210 and the bumps 212. In some embodiments, the underfill material may also contact the guard pads 228 and the guard features 230.

In an embodiment, the electronic package 250 may comprise an integrated heat spreader (IHS) 245. The IHS 245 may be thermally coupled to a surface of the die 240 (e.g., by a thermal interface material (TIM) (not shown)). The IHS 245 may also include supports 247 that extend down towards the surface of the package substrate 205. In an embodiment, the guard features 230 are positioned in locations that avoid the supports 247 of the IHS 245. For example, the guard features 230 may be within a footprint of the IHS 245 in some embodiments.

Figure 3A:
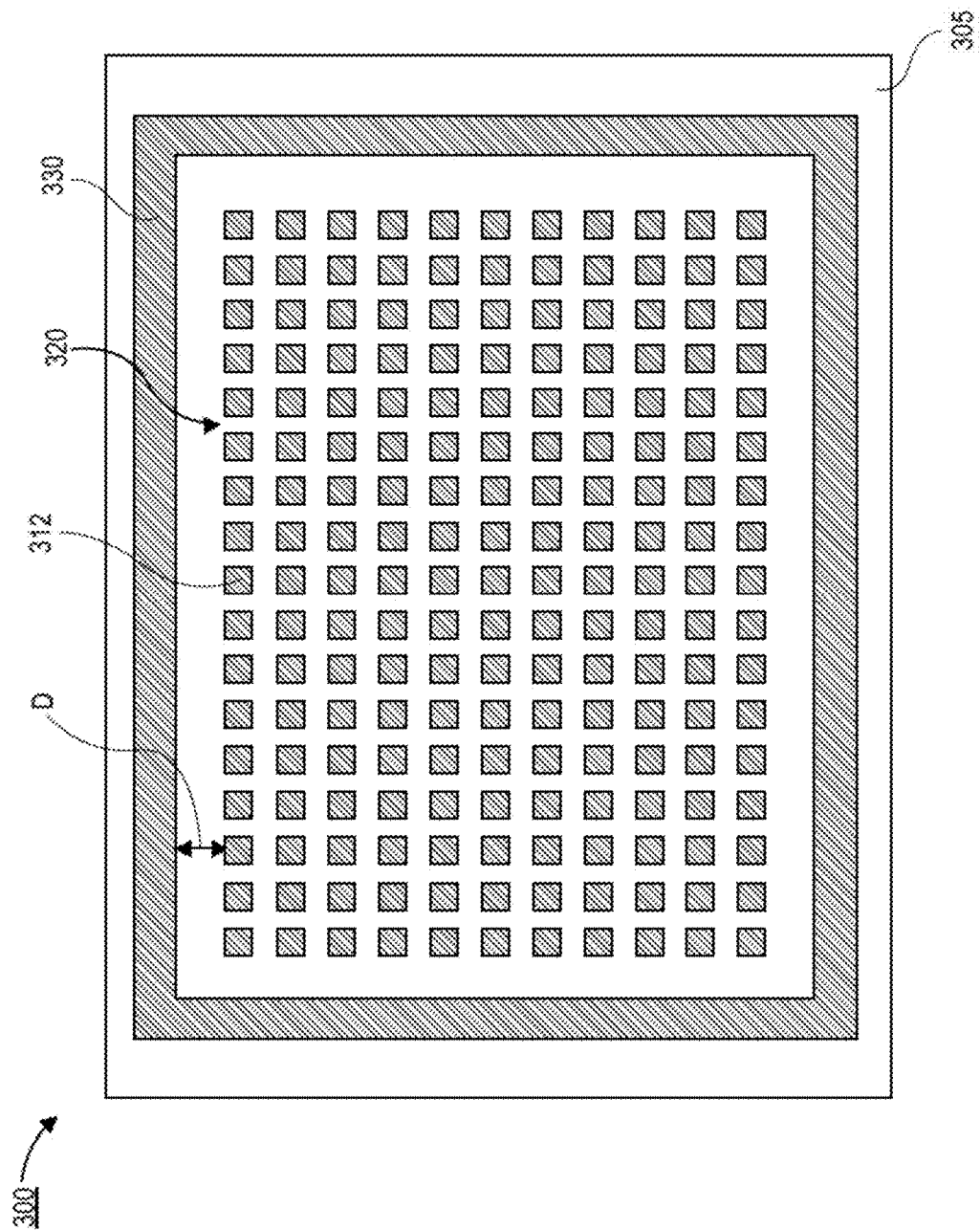
FIG. 3A is a plan view illustration of an FLI bump region on an electronic package with a ring guard feature, in accordance with an embodiment.

Referring now to FIG. 3A, a plan view illustration of an electronic package 300 is shown, in accordance with an additional embodiment. In an embodiment, the electronic package 300 may comprise a package substrate 305. An FLI bump region 320 comprising an array of bumps 312 may be disposed over a surface of the package substrate 305. In an embodiment, a guard feature 330 may be positioned adjacent to the FLI bump region 320. In the particular embodiment illustrated in FIG. 3A, the guard feature 330 is a ring guard feature 330. That is, the ring guard feature 330 may comprise a frame or ring that completely surrounds the FLI bump region 320.

Completely surrounding the FLI bump region 320 with a guard feature 330 may provide improved equalization of current density across the entire FLI bump region 320. However, the inclusion of a continuous ring may result in manufacturing challenges. Particularly, a ring guard feature 330 may result in the blocking of paths for underfill deposition. Whereas the corner guard features above provide openings to access the FLI bump region from the side, there is no such opening when a ring guard feature 330 is used.

Accordingly, in such embodiments the distance D between an interior surface of the ring guard feature 330 and the exterior edges of the FLI bump region 320 may need to be increased to satisfy keep out zone (KOZ) specifications. For example, the distance D may be approximately 3 mm or greater, or approximately 5 mm or greater. In the illustrated embodiment, the distance D is substantially uniform around the entire perimeter of the FLI bump region 320. However, it is to be appreciated that in some embodiments, the distance D may be larger along one edge of the FLI bump region 320.

Figure 3B:
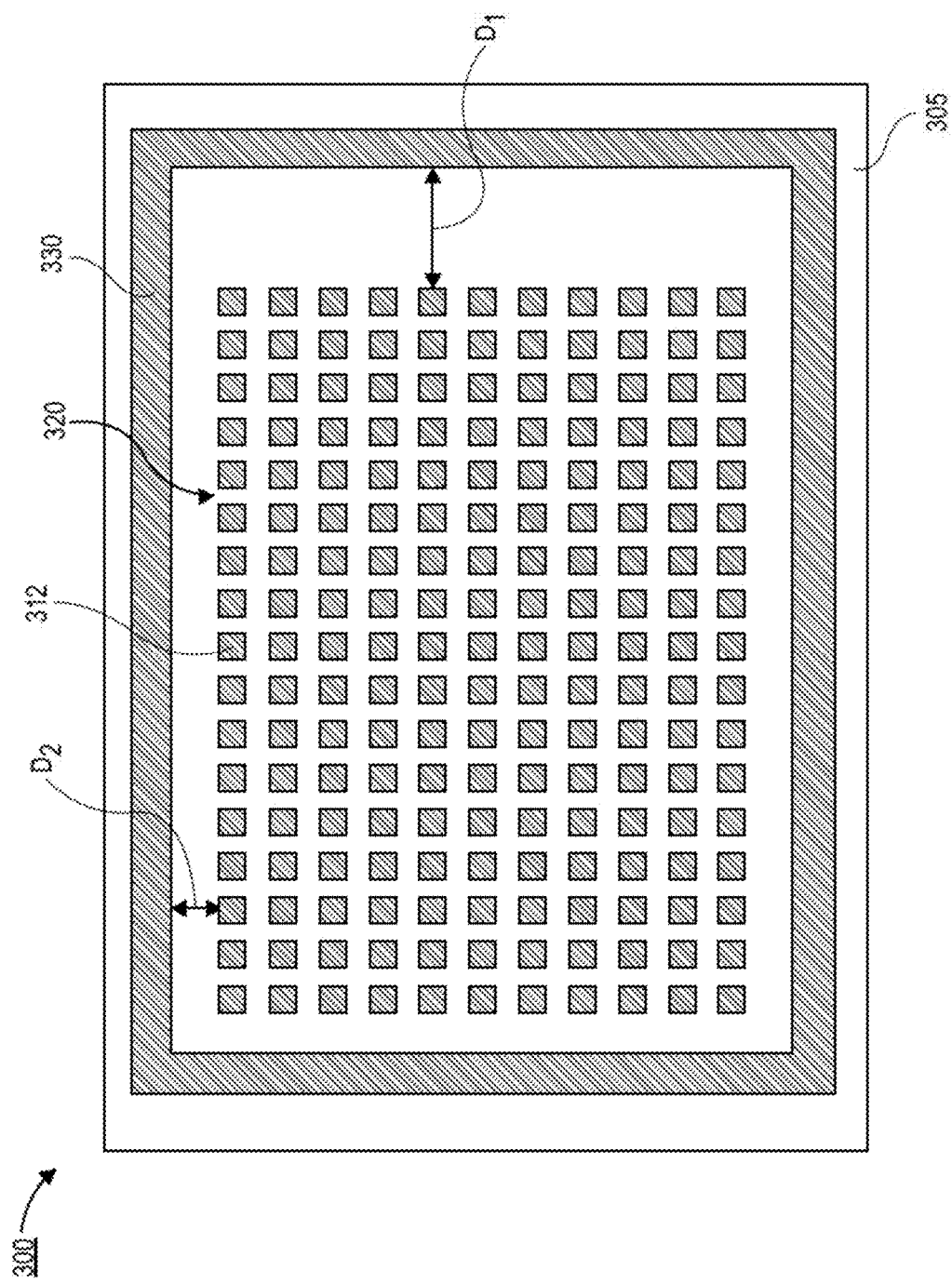
FIG. 3B is a plan view illustration of an FLI bump region on an electronic package with a ring guard feature that comprises a non-uniform spacing between an interior edge of the ring guard feature and an edge of the FLI bump region, in accordance with an embodiment.

For example, FIG. 3B is a plan view illustration of an electronic package 300 where a single interior edge of ring guard feature 330 may include a first distance $D_1$ that satisfies the KOZ specifications in order to have an access point for underfill material, in accordance with an embodiment. In an embodiment, the other interior edges of the ring guard feature 330 may include a distance $D_2$ that is less than the KOZ specification in order to maximize the current density equalization. For example, the first distance $D_1$ may be approximately 3 mm or greater and the second distance $D_2$ may be approximately 3 mm or less.

Figure 3C:
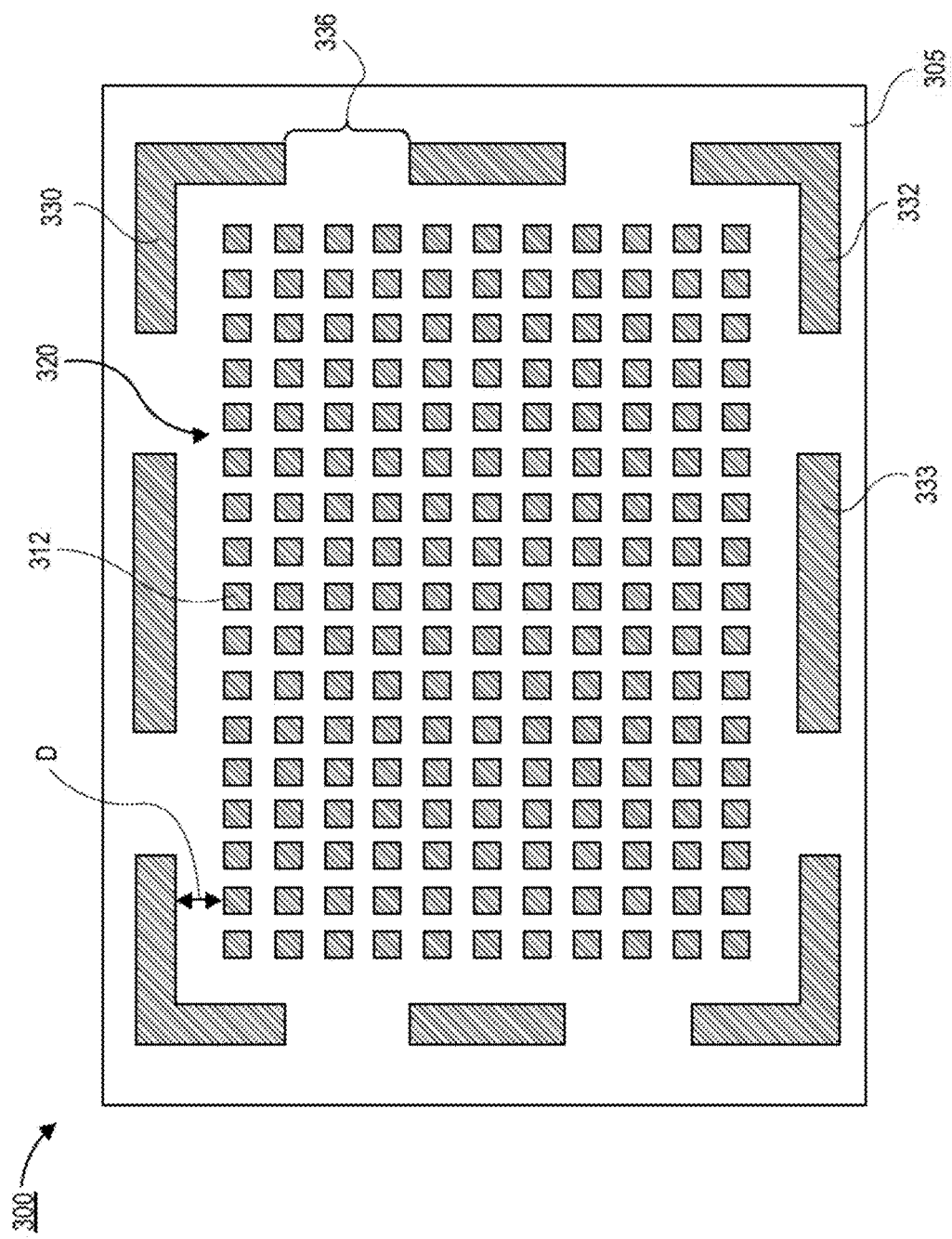
FIG. 3C is a plan view illustration of an FLI bump region on an electronic package with a ring guard feature that is segmented, in accordance with an embodiment.

Referring now to FIG. 3C, a cross-sectional illustration of an electronic package 300 is shown, in accordance with an additional embodiment. In an embodiment, the electronic package 300 may comprise a package substrate 305. An FLI bump region 320 comprising an array of bumps 312 may be disposed over a surface of the package substrate 305. In an embodiment, a guard feature 330 may be positioned adjacent to the FLI bump region 320. In the particular embodiment illustrated in FIG. 3A, the guard feature 330 comprises a segmented ring guard feature 330. That is, the ring guard feature 330 may comprise a frame or ring with openings 336 that surrounds the FLI bump region 320.

In the illustrated embodiment, the ring guard feature 330 comprises corner guard features 332 and side guard features 333. The side guard features 333 may be separated from the corner guard features 332 by the openings 336. In an embodiment, the openings 336 provide locations where underfill material (not shown) may be dispensed into the FLI bump region 320. Since there are dedicated openings for dispensing the underfill material, the distance D between an interior surface of the ring guard feature 330 and an edge of the FLI bump region 320 may be minimized. For example, the distance D may be approximately 3 mm or less.

Figure 4:
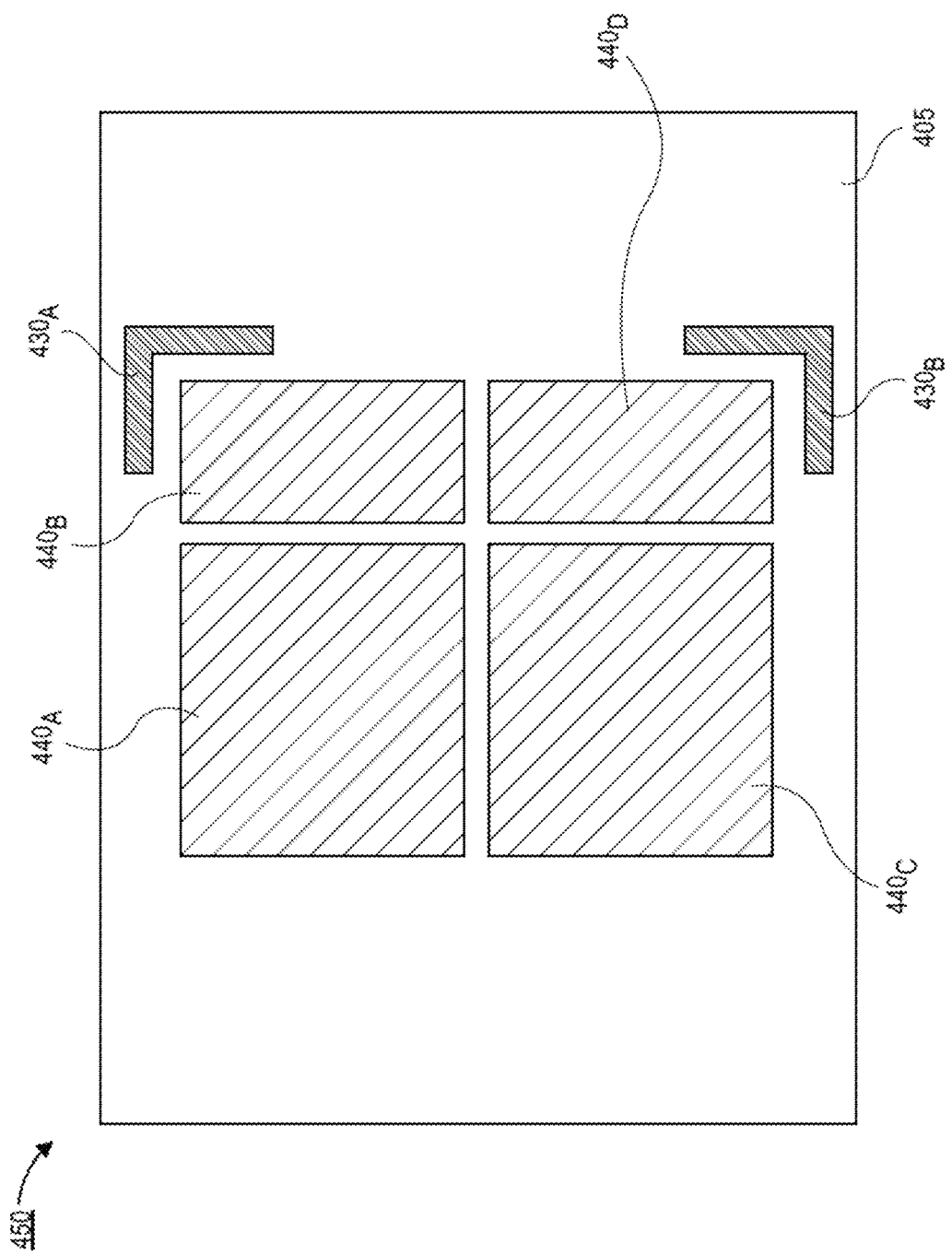
FIG. 4 is a plan view illustration of an electronic package with a plurality of dies and a plurality of corner guard features, in accordance with an embodiment.

Referring now to FIG. 4, a plan view illustration of an electronic package 450 is shown, in accordance with an embodiment. The electronic package 450 may comprise a package substrate 405. A plurality of dies $440_{A-D}$ may be attached to the package substrate 405. For example, each of the dies $440_{A-D}$ may be attached to the package substrate 405 by different FLI bump regions that are below the dies $440_{A-D}$ and therefore, not visible in FIG. 4. In an embodiment, one or more of the dies $440_{A-D}$ may be electrically coupled to each other and/or electrically coupled to additional components (not shown) by interposers. For example, the interposers may be embedded multi-die interconnect bridge (EMIB) dies that are embedded in the package substrate 405. In FIG. 4 four dies $440_{A-D}$ are shown. However, it is to be appreciated that the plurality of dies 440 may include any number of dies 440 (i.e., two or more dies 440).

In an embodiment, the electronic package 450 may further comprise one or more guard features 430. For example, a first guard feature $430_A$ is positioned adjacent to a corner of die $440_B$, and a second guard feature $430_B$ is positioned adjacent to a corner of die $440_D$. That is, in some embodiments, one or more of the plurality of dies $440_{A-D}$ may include no guard features 430 (e.g., die $440_A$ and die $440_C$ do not have guard features adjacent to them). Furthermore, while a single guard feature 430 is shown adjacent to dies $440_B$ and $440_D$, it is to be appreciated that a plurality of guard features 430 (i.e., two or more guard features 430) may be adjacent to one or more of the dies $440_{A-D}$. For example, a single die 440 of the plurality of dies $440_{A-D}$ may comprise one or more of corner guard features 430, side guard features 430, ring guard features 430, and segmented ring guard features 430, such as those described above.

Figure 5:
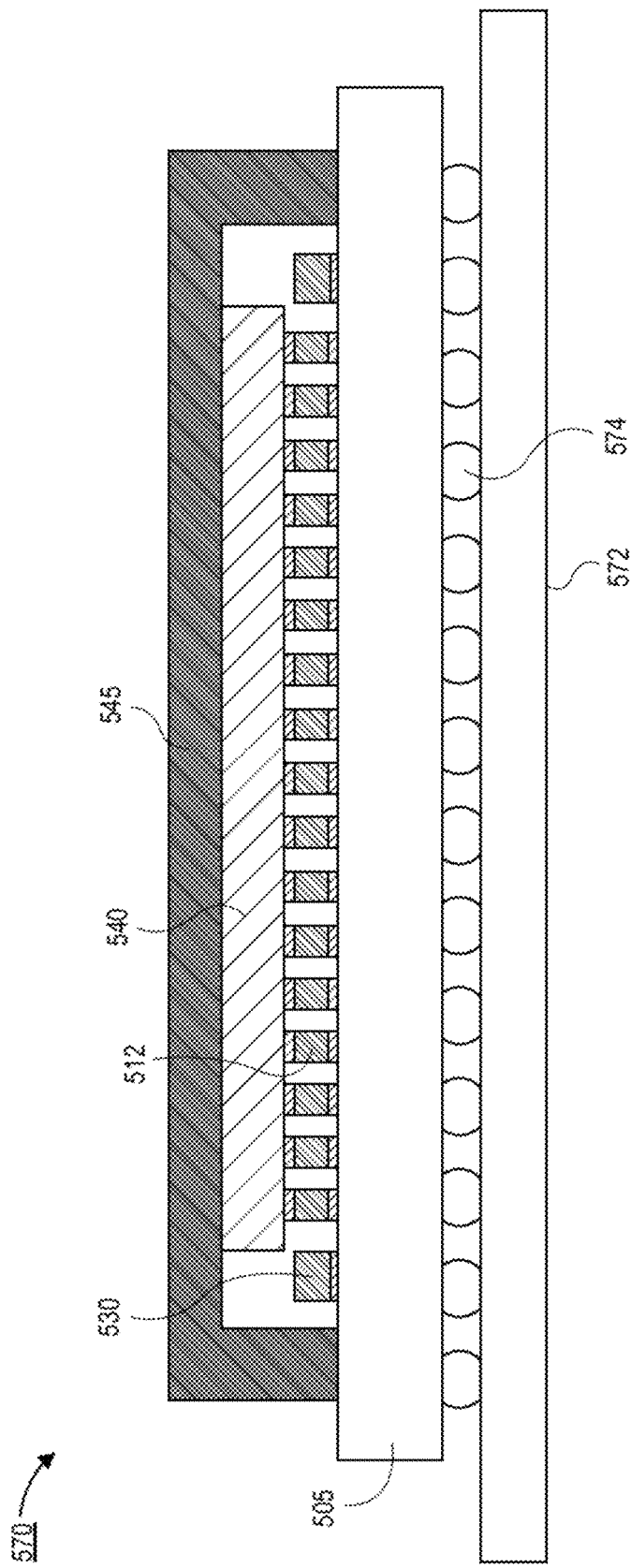
FIG. 5 is a cross-sectional illustration of an electronic system that comprises an electronic package with corner guard features, in accordance with an embodiment.

Referring now to FIG. 5, a cross-sectional illustration of an electronic system 570 is shown, in accordance with an embodiment. In an embodiment, the electronic system 570 may comprise a board 572, such as a mother board or the like. In an embodiment, the board 572 may be electrically coupled to a package substrate 505 by interconnects 574. While the interconnects 574 are illustrated as being solder bumps, it is to be appreciated that the interconnects 574 may comprise any suitable interconnect architecture, such as wire bonds, sockets, or the like.

In an embodiment, an array of bumps 512 may be disposed over a surface of the package substrate 505. The bumps 512 may be electrically coupled to a die 540. In an embodiment, an IHS 545 may be thermally coupled to the die 540 and attached to the package substrate 505. In an embodiment, one or more guard features 530 may be disposed over the package substrate 505. The guard features 530 may be adjacent to bumps 512. In an embodiment, the guard features 530 may comprise substantially the same material as the bumps 512. In an embodiment, the guard features 530 are electrically isolated from conductive circuitry of the die 540 and from conductive circuitry of the package substrate 505. That is, the guard features 530 are dummy features through which substantially no current passes during operation of the electronic system 570. In an embodiment, the guard features 530 are at least partially outside a footprint of the die 540 and/or within a footprint of the IHS 545.

Figure 6:
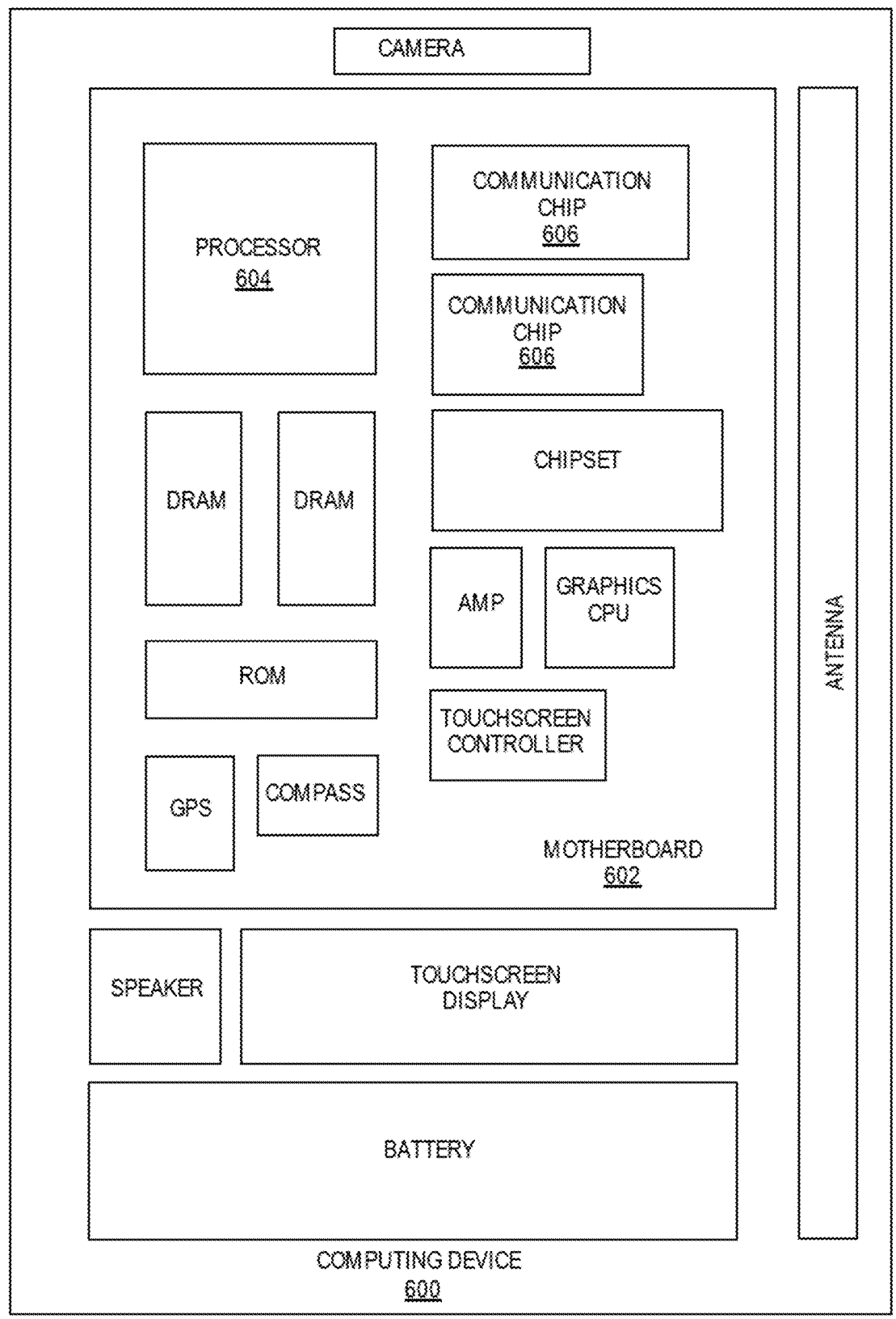
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be packaged to a package substrate that comprises an FLI bump region and one or more guard features adjacent to the FLI bump region, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be packaged to a package substrate that comprises an FLI bump region and one or more guard features adjacent to the FLI bump region, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a first level interconnect (FLI) bump region on the package substrate, wherein the FLI bump region comprises: a plurality of pads; and a plurality of bumps, wherein each bump is over a different one of the plurality of pads; and a guard feature adjacent to the FLI bump region, wherein the guard feature comprises: a guard pad; and a guard bump over the guard pad, wherein the guard feature is electrically isolated from circuitry of the electronic package.

Example 2: the electronic package of Example 1, wherein the guard feature is proximate to a corner of the FLI bump region.

Example 3: the electronic package of Example 2, wherein the guard feature is substantially L-shaped, and wherein the guard feature wraps around the corner of the FLI bump region.

Example 4: the electronic package of claim 3, wherein a first arm of the guard feature and a second arm of the guard feature have lengths that are approximately 15 mm or less.

Example 5: the electronic package of Examples 1-4, further comprising: a plurality of guard features, wherein the plurality of guard features are positioned around a perimeter of the FLI bump region.

Example 6: the electronic package of Examples 1-5, wherein the plurality of guard features are positioned proximate to two or more corners of the FLI bump region.

Example 7: the electronic package of Examples 1-6, wherein an interior surface of the guard feature is spaced away from a nearest bump pad of the FLI bump region by approximately 3 mm or less.

Example 8: the electronic package of Examples 1-7, wherein a bump height thickness variation of the plurality of bumps in the FLI bump region is less than approximately 10 μm.

Example 9: the electronic package of Examples 1-8, wherein the guard feature comprises a ring surrounding the FLI bump region.

Example 10: the electronic package of Examples 1-9, wherein the plurality of bumps in the FLI bump region are copper bumps.

Example 11: the electronic package of Examples 1-10, wherein the plurality of bumps in the FLI bump region are solder bumps.

Example 12: an electronic package, comprising: a package substrate; a first level interconnect (FLI) bump region over the package substrate, the FLI bump region comprising: a plurality of pads; and a plurality of bumps, wherein each of the bumps is over a different one of the plurality of pads; and a guard feature adjacent to the FLI bump region, wherein the guard feature comprises the same material as the plurality of bumps, and wherein the guard feature is electrically isolated from circuitry of the electronic package; and a die electrically coupled to the package substrate by the plurality of bumps.

Example 13: the electronic package of Example 12, wherein the guard feature is at least partially outside a footprint of the die.

Example 14: the electronic package of Example 12 or Example 13, further comprising: an integrated heat spreader (IHS) over the die and attached to the package substrate by one or more supports, wherein the guard feature is within a footprint of the IHS.

Example 15: the electronic package of Examples 12-14, wherein the plurality of bumps are copper bumps.

Example 16: the electronic package of Examples 12-15, wherein the plurality of bumps are solder bumps.

Example 17: the electronic package of Examples 12-16, wherein the plurality of bumps comprise a bump height thickness variation that is less than approximately 10 μm.

Example 18: the electronic package of Examples 12-17, further comprising: a plurality of FLI bump regions; and a plurality of dies, wherein each die is attached to the package substrate by a different one of the plurality of FLI bump regions.

Example 19: the electronic package of Example 18, further comprising: a plurality of guard features, wherein one or more of the plurality of FLI bump regions are adjacent to different ones of the plurality of guard features.

Example 20: the electronic package of Examples 12-19, wherein the guard feature is proximate to a corner of the FLI bump region.

Example 21: the electronic package of Example 20, wherein the guard feature is substantially L-shaped, and wherein the guard feature wraps around the corner of the FLI bump region.

Example 22: the electronic package of Example 21, wherein a first arm of the guard feature and a second arm of the guard feature have lengths that are approximately 15 mm or less.

Example 23: an electronic system, comprising: a board; an electronic package electrically coupled to the board, wherein the electronic package comprises: a first level interconnect (FLI) bump region; and a guard feature proximate to the FLI bump region, wherein the guard feature is electrically isolated from circuitry of the electronic system; and a die electrically coupled to the electronic package.

Example 24: the electronic system of Example 23, wherein the guard feature is substantially L-shapes and wraps around a corner of the FLI bump region.

Example 25: the electronic system of Example 23 or Example 24, wherein the FLI bump region comprises a plurality of bumps, and wherein a bump height thickness variation of the plurality of bumps is less than approximately 10 μm.

What is claimed is:

1. An electronic package, comprising:
a package substrate;
a die coupled to the package substrate, the die having a footprint;
a first level interconnect (FLI) bump region on the package substrate and within the footprint of the die, wherein the FLI bump region comprises:
a plurality of pads; and
a plurality of bumps, wherein each bump is over a different one of the plurality of pads; and
a guard feature adjacent to the FLI bump region and outside of the footprint of the die, wherein the guard feature comprises:
a guard pad; and
a guard bump over the guard pad, the guard bump having substantially the same height as a bump of the plurality of bumps of the FLI bump region, wherein the guard feature is electrically isolated from circuitry of the electronic package.

2. The electronic package of claim 1, wherein the guard feature is proximate to a corner of the FLI bump region.

3. The electronic package of claim 2, wherein the guard feature is substantially L-shaped, and wherein the guard feature wraps around the corner of the FLI bump region.

4. The electronic package of claim 3, wherein a first arm of the guard feature and a second arm of the guard feature have lengths that are approximately 15 mm or less.

5. The electronic package of claim 1, further comprising:
a plurality of guard features, wherein the plurality of guard features are positioned around a perimeter of the FLI bump region.

6. The electronic package of claim 1, wherein the plurality of guard features are positioned proximate to two or more corners of the FLI bump region.

7. The electronic package of claim 1, wherein an interior surface of the guard feature is spaced away from a nearest bump pad of the FLI bump region by approximately 3 mm or less.

8. The electronic package of claim 1, wherein a bump height thickness variation of the plurality of bumps in the FLI bump region is less than approximately 10 μm.

9. The electronic package of claim 1, wherein the guard feature comprises a ring surrounding the FLI bump region.

10. The electronic package of claim 1, wherein the plurality of bumps in the FLI bump region are copper bumps.

11. The electronic package of claim 1, wherein the plurality of bumps in the FLI bump region are solder bumps.

12. An electronic package, comprising:
a package substrate;
a first level interconnect (FLI) bump region over the package substrate, the FLI bump region comprising:
a plurality of pads; and
a plurality of bumps, wherein each of the bumps is over a different one of the plurality of pads; and
a guard feature adjacent to the FLI bump region, the guard feature having substantially the same height as a bump of the plurality of bumps of the FLI bump region, wherein the guard feature comprises the same material as the plurality of bumps, and wherein the guard feature is electrically isolated from circuitry of the electronic package; and
a die electrically coupled to the package substrate by the plurality of bumps, the die having a footprint, wherein the plurality of bumps is within the footprint of the die, and the guard feature is outside of the footprint of the die.

13. The electronic package of claim 12, wherein the guard feature is at least partially outside a footprint of the die.

14. The electronic package of claim 12, further comprising:
an integrated heat spreader (IHS) over the die and attached to the package substrate by one or more supports, wherein the guard feature is within a footprint of the IHS.

15. The electronic package of claim 12, wherein the plurality of bumps are copper bumps.

16. The electronic package of claim 12, wherein the plurality of bumps are solder bumps.

17. The electronic package of claim 12, wherein the plurality of bumps comprise a bump height thickness variation that is less than approximately 10 μm.

18. The electronic package of claim 12, further comprising:
 a plurality of FLI bump regions; and
 a plurality of dies, wherein each die is attached to the package substrate by a different one of the plurality of FLI bump regions.

19. The electronic package of claim 18, further comprising:
 a plurality of guard features, wherein one or more of the plurality of FLI bump regions are adjacent to different ones of the plurality of guard features.

20. The electronic package of claim 12, wherein the guard feature is proximate to a corner of the FLI bump region.

21. The electronic package of claim 20, wherein the guard feature is substantially L-shaped, and wherein the guard feature wraps around the corner of the FLI bump region.

22. The electronic package of claim 21, wherein a first arm of the guard feature and a second arm of the guard feature have lengths that are approximately 15 mm or less.

23. An electronic system, comprising:
 a board;
 an electronic package electrically coupled to the board, wherein the electronic package comprises:
  a first level interconnect (FLI) bump region; and
  a guard feature proximate to the FLI bump region, the guard feature having substantially the same height as a bump of the FLI bump region, wherein the guard feature is electrically isolated from circuitry of the electronic system; and
 a die electrically coupled to the electronic package, the die having a footprint, wherein the FLI bump region is within the footprint of the die, and the guard feature is outside of the footprint of the die.

24. The electronic system of claim 23, wherein the guard feature is substantially L-shapes and wraps around a corner of the FLI bump region.

25. The electronic system of claim 23, wherein the FLI bump region comprises a plurality of bumps, and wherein a bump height thickness variation of the plurality of bumps is less than approximately 10 μm.

\* \* \* \* \*